United States Patent
Cunningham et al.

(10) Patent No.: US 8,310,877 B2
(45) Date of Patent: Nov. 13, 2012

(54) READ CONDITIONS FOR A NON-VOLATILE MEMORY (NVM)

(75) Inventors: Jeffrey C. Cunningham, Austin, TX (US); Thomas D. Cook, Austin, TX (US); Stephen F. McGinty, Austin, TX (US); Ronald J. Syzdek, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 129 days.

(21) Appl. No.: 12/985,724

(22) Filed: Jan. 6, 2011

(65) Prior Publication Data

US 2012/0176844 A1     Jul. 12, 2012

(51) Int. Cl.
*G11C 16/04*     (2006.01)
(52) U.S. Cl. ............ 365/185.21; 365/185.2; 365/185.22
(58) Field of Classification Search ............... 365/185.21
See application file for complete search history.

(56) References Cited

U.S. PATENT DOCUMENTS

| | | | |
|---|---|---|---|
| 6,226,200 B1 | 5/2001 | Eguchi et al. | |
| 6,996,012 B2* | 2/2006 | Jung ........................ | 365/185.3 |
| 7,167,395 B1* | 1/2007 | Kobernik et al. ........ | 365/185.21 |
| 7,184,313 B2 | 2/2007 | Betser et al. | |
| 7,242,618 B2* | 7/2007 | Shappir et al. .......... | 365/185.2 |
| 7,339,826 B2* | 3/2008 | Lusky .................... | 365/185.14 |
| 7,535,765 B2* | 5/2009 | Maayan .................... | 365/185.2 |
| 7,558,149 B2* | 7/2009 | Chen et al. .............. | 365/233.11 |
| 7,593,259 B2* | 9/2009 | Kim ......................... | 365/185.03 |
| 7,623,389 B2 | 11/2009 | Lee et al. | |
| 7,672,166 B2 | 3/2010 | Park et al. | |
| 7,688,634 B2* | 3/2010 | Richter et al. ........... | 365/185.2 |
| 2008/0117685 A1 | 5/2008 | Syzdek et al. | |
| 2008/0120526 A1 | 5/2008 | Eguchi et al. | |
| 2009/0323423 A1 | 12/2009 | Bloom et al. | |
| 2010/0020611 A1 | 1/2010 | Park | |

* cited by examiner

*Primary Examiner* — Son Mai
(74) *Attorney, Agent, or Firm* — James L. Clingan, Jr.; Daniel D. Hill

(57) ABSTRACT

A method and memory are provided for determining a read reference level for a plurality of non-volatile memory cells. The method includes: performing a program operation of the plurality of non-volatile memory cells; determining a program level of a least programmed memory cell of the plurality of memory cells; performing an erase operation of the plurality of non-volatile memory cells; determining an erase level of a least erased memory cell of the plurality of memory cells; determining an operating window between the program level and the erase level; and setting the read reference level to be a predetermined offset from the erase level if the operating window is determined to compare favorably to a predetermined value. The memory includes registers for storing the program level and the erase level.

20 Claims, 5 Drawing Sheets

READ CONDITIONS FOR A NON-VOLATILE MEMORY (NVM)

BACKGROUND

1. Field

This disclosure relates generally to non-volatile memories (NVMs), and more specifically, to conditions for performing a read of memory cells of an NVM.

2. Related Art

An NVM typically has millions of memory transistors that are in a programmed or erased state. A transistor is programmed or erased by adjusting the threshold of the transistor through some form of tunneling of charges into the gate oxide so that if the gate and source of the transistor are biased to a pre-determined voltage and a pre-determined current is impressed on the drain of the transistor as shown in FIG. 1, the drain current of the transistor will be a measure of the programmed or erased state of the transistor.

The difference between the program and erase voltages for the transistors in the array will be dependent on process variations, variations in the voltages used to force charge tunneling, temperature, program/erase disturb, trap up, and the number of times the transistor has been erased and programmed. In general if all transistors are erased and the drain voltages are measured the result will be a roughly Gaussian distribution as shown in FIG. 2. For some NVM's the mean of the distribution will be a low voltage and the highest voltage in the distribution is called the "least erased level" (LEL). For those NVM's the mean of the distribution of programmed transistors will be a higher voltage and the lowest voltage in the distribution is called the "least programmed level" (LPL) as shown in FIG. 3. After a transistor is programmed or erased the drain voltage is checked to insure the drain voltage is less than the LEL or greater than the LPL. Verification voltages, called the "Erase Verify" (EV) and "Program Verify" (PV) voltages are selected to insure that a transistor is successfully programmed or erased. The EV is slightly greater than the LEL and the PV is slightly less than the LPL.

During normal operation, to determine if the transistor is programmed or erased, the drain voltage is compared to a pre-determined READ voltage by a sense amplifier. The READ voltage is generally a value greater than the LEL voltage and less than the LPL voltage. The selection of the READ voltage can be difficult because the difference between the LEL and the LPL may not be large and cannot be determined a priori. In addition, the LEL and LPL will shift during the life of the NVM. Finally, other design constraints such as sense amplifier resolution will constrict the usable window between the LEL and LPL. Selection of the READ, PV, and EV voltages requires a great deal of effort. Typically a large number of NVM arrays from a large number of wafers are operated and tested for a considerable time in an effort to predict the lifetime performance of the NVM. FIG. 5 shows the variation in the erase and program distributions that are caused by processing variation, aging and cycling. This is an expensive undertaking and greatly extends the development time of NVM technology.

Accordingly, it is desirable to improve upon the issues raised above concerning reading an NVM memory.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an NVM has it cells programmed and the level at which the least programmed cell is verified is determined and stored. Similarly for erasing, the cells are erased and the level at which the least erased cell is verified is determined and stored. A determination is made if this difference between these two levels is sufficient. If the difference is sufficient, an optimum verify level is chosen between the two levels. This is better understood by reference to the following description and the drawings.

Figure 6:
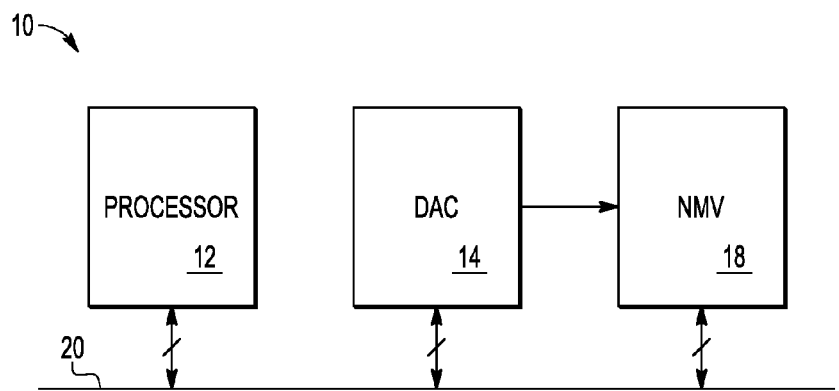
FIG. 6 is a block diagram of a system having an NVM in which the system may be an integrated circuit according to an embodiment.

Shown in FIG. 6 is a system 10 including a processor 12 coupled to a bus 20, a digital to analog converter (DAC) 14, and a non-volatile memory (NVM) 18 coupled to bus 20. DAC 14 is also directly coupled to NVM 18. DAC 14 provides an analog signal selected by processor 12 for use as a verify voltage. DAC 14 may be also connected to other elements of system 10 not shown in FIG. 6.

Figure 7:
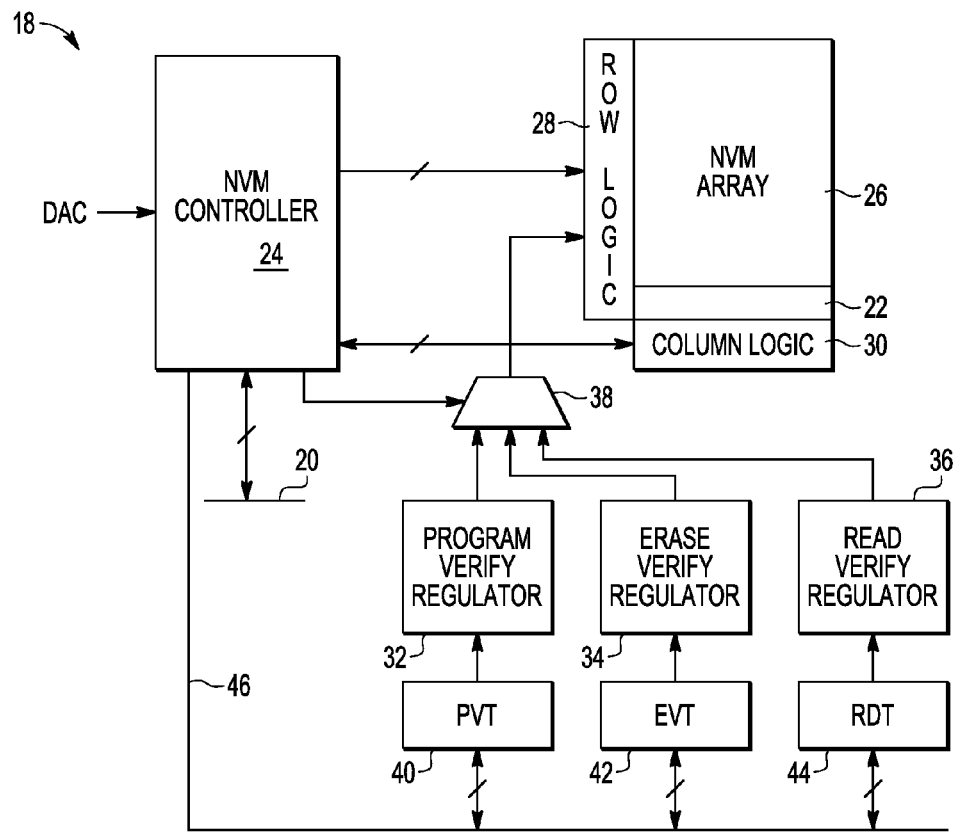
FIG. 7 is a block diagram of the NVM of FIG. 6.

Shown in FIG. 7 is NVM 18 in more detail. NVM 18 has an NVM array 26, a protected storage region 22 of NVM array 26, an NVM controller 24, row logic 28 coupled to NVM array 26 and to NVM controller 24, column logic 30 coupled to NVM array 26 and NVM controller 24, a program verify regulator 32, an erase verify regulator 34, a read regulator 36, a multiplexer 38 having three inputs coupled respectively to outputs of program verify regulator 32, erase verify regulator 34, and read verify regulator 36, a program verify trim (PVT) register coupled to program verify regulator 32 and to a bus 46 that is coupled to NVM controller 24, an erase verify trim (EVT) register 42 coupled to erase verify regulator 34 and to bus 46, and a read trim (RDT) register 44 coupled to read regulator 36 and bus 46.

Figure 8:
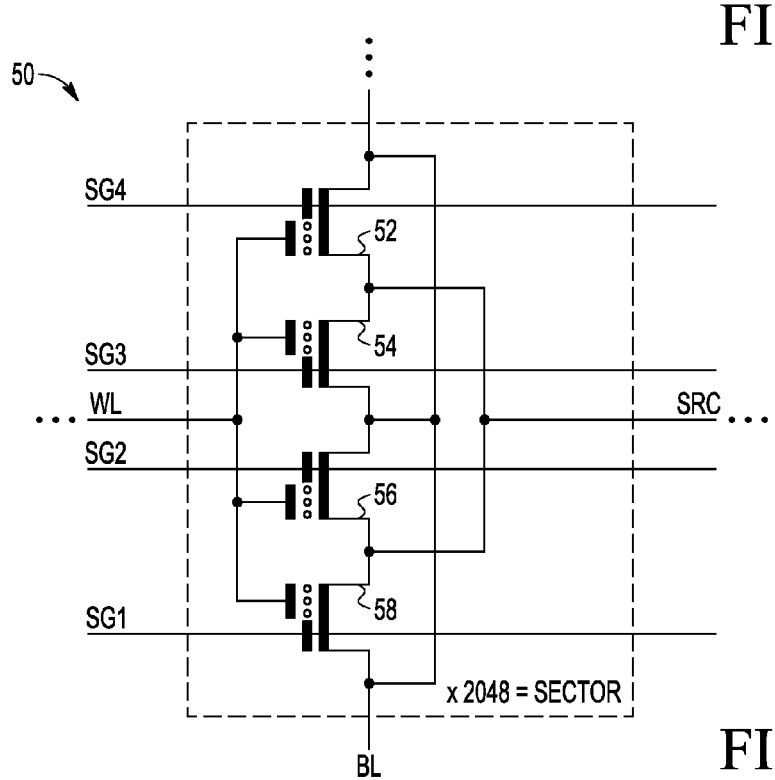
FIG. 8 is a circuit diagram of a portion of an NVM array of FIG. 7.

Shown in FIG. 8 is a portion 50 of NVM array including NVM memory cells 52, 54, 56, and 58 which are split NVM memory cells in that they each have a control gate and a select gate. Memory cell 52 has a select gate coupled to a select gate line SG4, a control gate coupled to a word line WL, a first current electrode coupled to a source SRC, and a second current electrode coupled to a bit line. Memory cell 54 has a select gate coupled to a select gate line SG3, a control gate coupled to word line WL, a first current electrode coupled to source SRC, and a second current electrode coupled to bit line BL. Memory cell 56 has a select gate coupled to a select gate line SG1, a control gate coupled to a word line WL, a first current electrode coupled to a source SRC, and a second current electrode coupled to bit line BL. Memory cell 58 has a select gate coupled to a select gate line SG1, a control gate coupled to word line WL, a first current electrode coupled to source SRC, and a second current electrode coupled to bit line BL. Charge storage, which may be nanocrystals, is shown under the select gates. Portion 50 is a unit of 4 cells that is repeated along the row direction and column direction. In the row direction, the select gate lines extend to the units in that direction as does the word line and source line. Each unit in the row direction is connected to different bit lines. In the column direction, the units are connected to bit line BL but to a different source line. During a read, a voltage is applied to both the select gate and control gate of a selected memory cell. Within a unit, the select gate lines SG1, SG2, SG3, and SG4 distinguish as to which cell is selected for reading. For programming, selected cells as selected by select gate lines SG1, SG2, SG3, and SG4 are programmed. The voltage on the word line is varied during erase verify and program verify to identify where memory cells can be read as programmed or erased after programming and erasing respectively using a different level for the voltage applied to the word line. The voltage on the word line during a read is considered the read voltage. This is the voltage that is to be optimized by a method 60 shown in FIG. 9 for a normal read.

Figure 9:
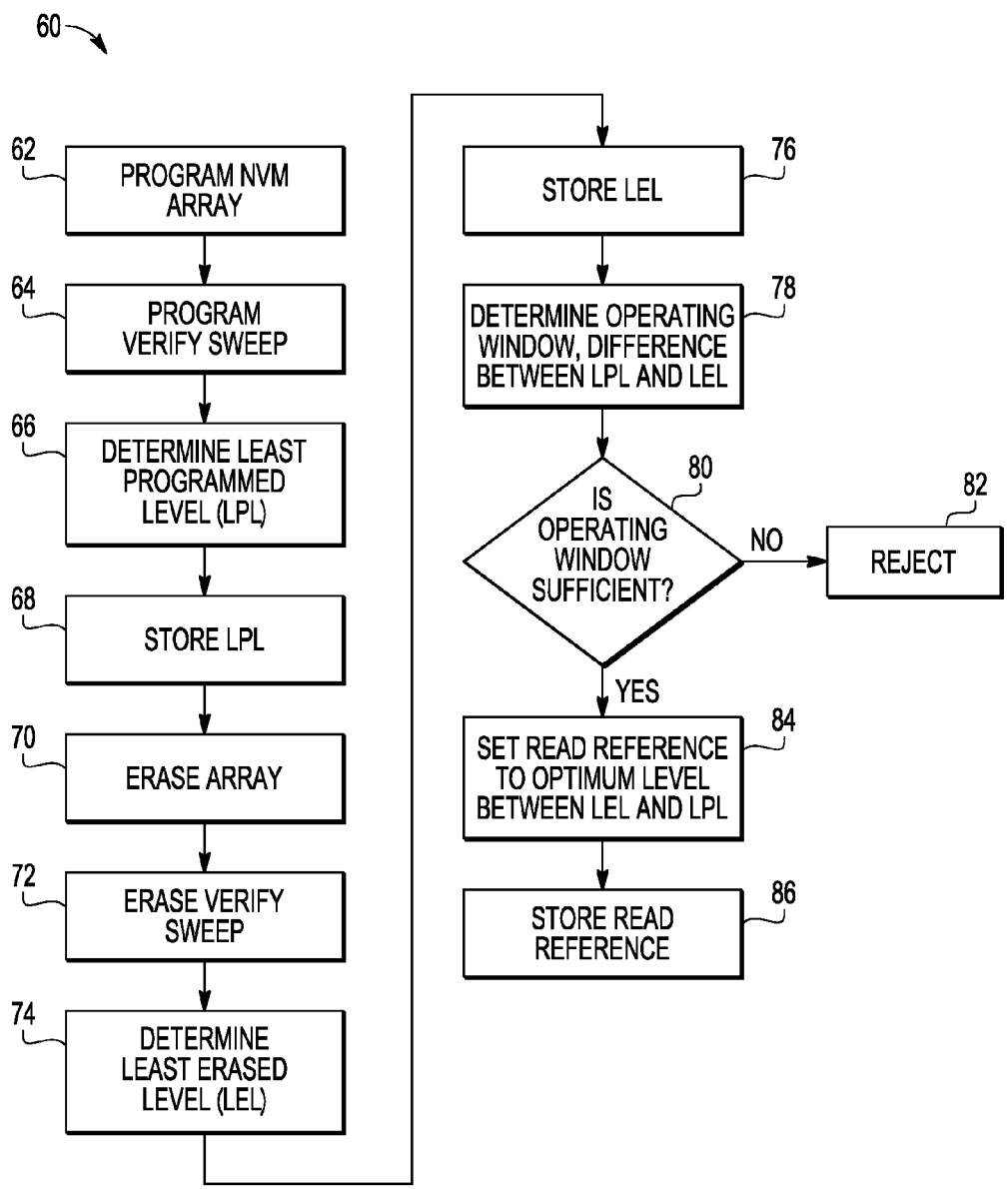
FIG. 9 is a flow diagram according to the embodiment.

Shown in FIG. 9 is method 60 for obtaining a read voltage for NVM 18. NVM array 26 is programmed as shown in step 62. This is achieved by applying voltages to the first and second current electrodes and the split and control gates in a manner known. One way this may be achieved is by performing programming on 32 memory cells at a time. This programming is not intended for programming data but as part of the test operation which is preferably performed under the control of processor 12. This allows for avoiding the use of a tester which may be both a bottle neck slowing down shipping as well as requiring expensive equipment. NVM controller 24 controls row logic 28 to provide the desired program voltages for the select and control gates and applying the desired voltages to the bit lines and source lines through column logic 30.

After programming, a program verify shown as step 64 is performed by sweeping through the possible control gate voltages using a voltage provided by DAC 14 as selected by NVM controller 24. NVM controller 24 directs DAC 14 to provide the desired voltage as the control gate voltage applied to the selected word line for reading. Column logic 30 selects each cell for reading along the selected word line as controlled by NVM controller 24. Control logic 30 reads the state of the selected cells and communicates that to NVM controller 24. If there are any memory cells that are read as erased then NVM controller 24 directs DAC 14 to reduce its output to a lower voltage for the read voltage applied to word lines. The memory cells are again read. If there are any cells are still be read as erased the read voltage is again reduced by reducing the output of DAC 14. The process of reading the memory cells and reducing the read voltage until all of the memory cells are read as programmed. When this first occurs, as step 66, the read voltage at this point is the read voltage of the cell that is least programmed and may be considered the least programmed level (LPL). All of the memory cells are either at this same level of least programmed or are more programmed. The LPL is read level is then stored, as step 68, in register 40 as the program verify trim voltage. With DAC 14 providing the read voltage, there is a digital representation of the LPL which is conveniently stored in program verify trim register 40.

A similar process is performed for erase. NVM array 26 is erased as step 70. This erase is a conventional erase and may be performed in bulk. NVM array 26 may be divided into blocks and the blocks erased in some desired sequence. For a flash type of NVM, each block itself would be erased in bulk. An erase verify is performed by sweeping the read voltage. An initial read voltage is chosen by NVM controller 24 from DAC 14 as the read voltage for verifying that all of the memory cells have been erased. If any of the memory cells are read as not erased, NVM controller 24 selects a higher voltage for the read voltage and runs the test again. Again if any of the memory cells are read as not erased, NVM controller 24 again selects a higher voltage for the read voltage. This process of verifying and incrementing if not all of the memory cells are erased continues until the step of verifying shows that all of the memory cells have been erased. This read voltage is then determined, as step 74 as the level of the memory cell that is least erased and called the least erased level (LEL). The digital representation of the LEL is then stored, as step 76, in erase verify trim register 42.

After LEL and LPL have been determined an operating window is the difference between these two levels and is determined as step 78 by subtracting the LEL from the LPL. A determination is then made if this operating window is sufficient. Sufficiency would be based on characterization data that would indicate what is the minimum operating window that will allow NVM 18 to meet the required specification. An important specification that is particularly dependent on a sufficient operating window is endurance stated at least in part as the number of program/erase cycles that the memory can have and still function properly. If the operating window is too small to ensure that the endurance specification or some other specification will be met, then NVM 18 and almost certainly the entire integrated circuit will be rejected as step 82.

Figure 1:
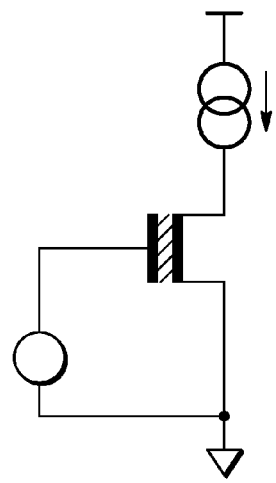
FIG. 1 is a circuit diagram of an NVM bit cell that is used to form an array of NVM bit cells in which the NVM bit cell is biased in its read condition according to the prior art.
Figure 2:
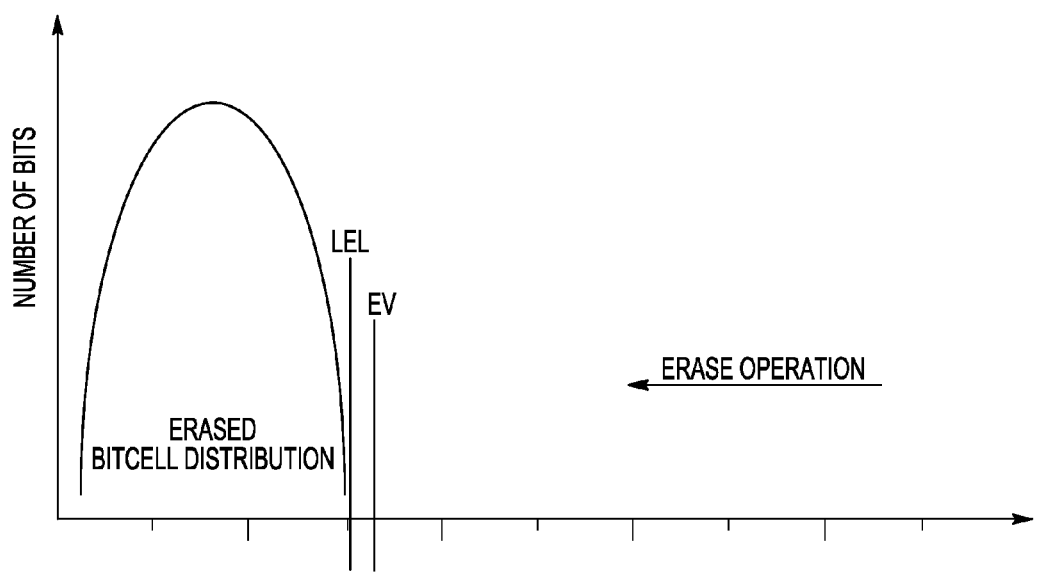
FIG. 2 is an erased distribution of an array of NVM bit cells using the NVM bit cell of FIG. 1.
Figure 3:
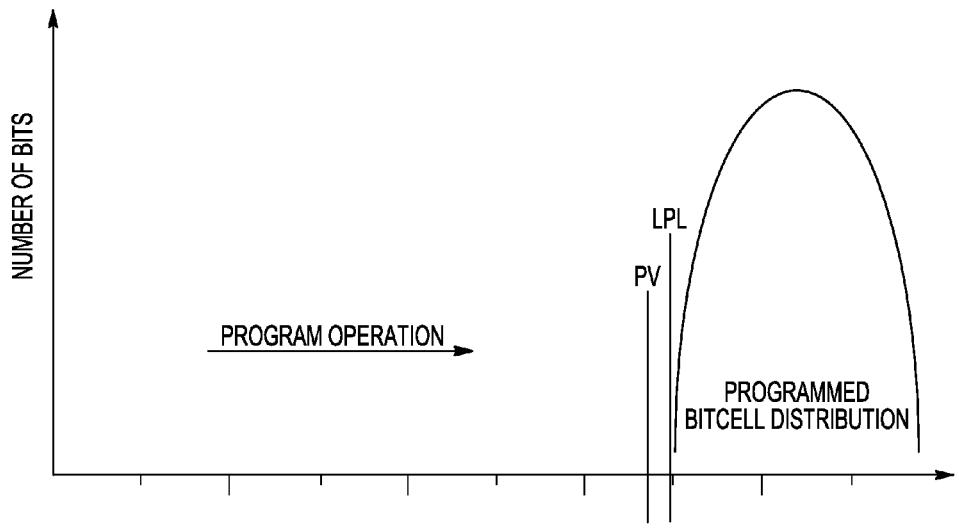
FIG. 3 is a programmed distribution of an array of NVM bit cells using the NVM bit cell of FIG. 1.
Figure 4:
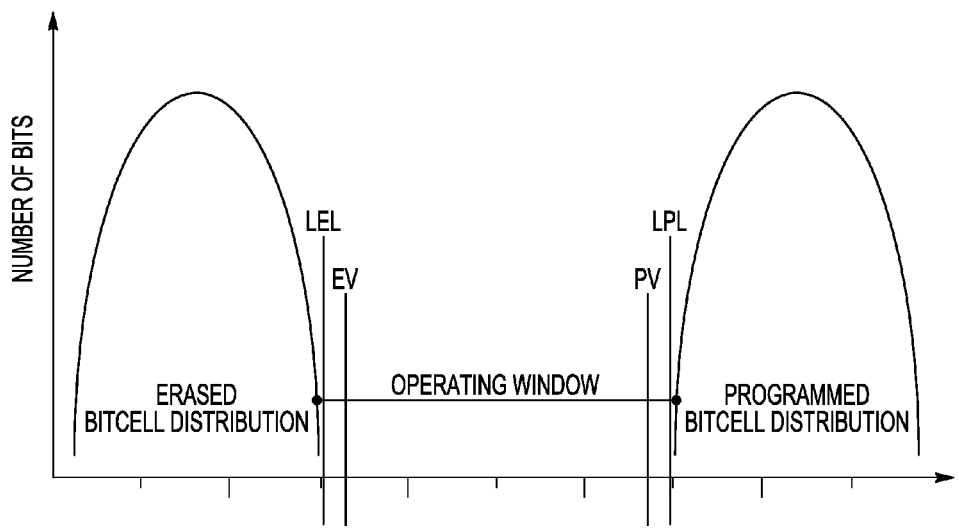
FIG. 4 is shows diagram of the distributions of FIGS. 2 and 3 to show an operating window.
Figure 5:
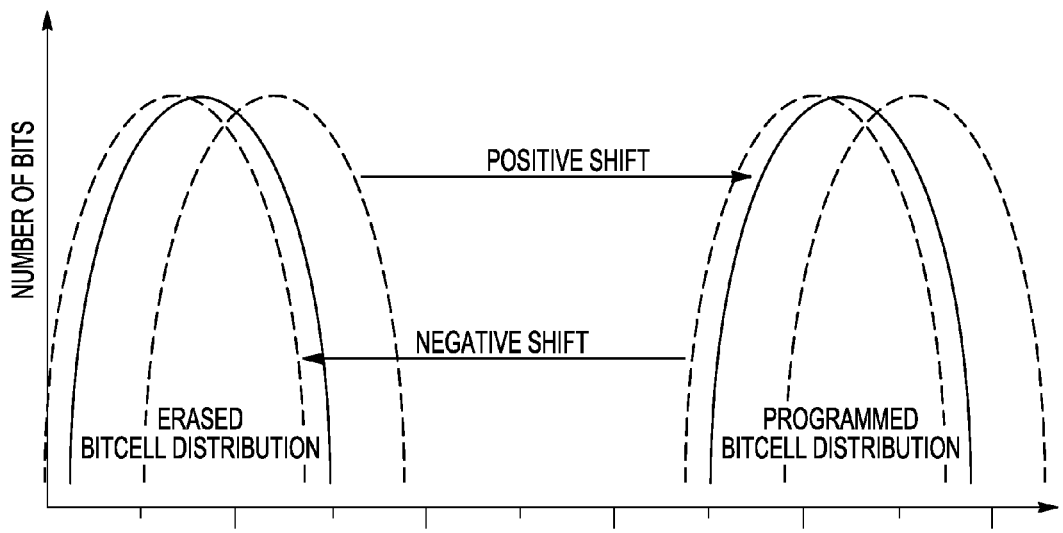
FIG. 5 is shows the diagram of FIG. 4 with processing variations.

If the operating window (an operating window is shown in FIG. 4) is sufficient, then the read reference will be set to an optimum setting between LEL and LPL. The characteristics of NVM 26 are important in this determination. With regard to the split gate type cell using nanocrystal charge storage, the optimum is a predetermined amount above the LEL and closer to the LEL than the LPL. Over many program/erase cycles the programming levels degrade more than the erasing levels degrade. Also the erase degradation seems to slow down. Thus, a fixed amount above the LEL is preferred when this type of scenario is present. Four hundred millivolts is believed to be effective. Thus, for step 84, the optimum level for the read reference, the read voltage for normal operation, is LEL plus 400 millivolts. Other device characterizations, however, may result in a different outcome. Thus, characterization of the particular memory cell used is important. The particular optimum may take into account circuit complexity as well so that the optimum may not be just an issue of characterization but also cost, size, and complexity. The optimum read reference is then stored in read trim register 44. The values stored in registers 40, 42, and 44 are then stored in protected storage 22. Protected storage is not available for modification. When power is removed, protected storage stores the LEL, LPL, and the read reference. When power is restored, the LEL, LPL, and read reference are loaded into registers 40, 42, and 44, respectively. Also subsequent block erases are controlled so that a routine block erase will not erase protected storage 22.

In normal read operation, NVM controller 24 selects the output of read regulator 36 for the output of multiplexer 38 to row logic 28. Read regulator 36, DAC 14, program verify regulator 32, and erase verify regulator 34 are all calibrated so that the digital representation of a particular analog voltage level is the same or at directly translatable. Thus, the value stored in PVT register 40 will result in program verify regulator 32 providing the same output as provided by DAC 14 as the LPL. Similarly, the value stored in EVT register 42 will result in erase verify regulator 34 providing the same output as provided by DAC 14 as the LEL. Also the value stored in read register 44 results in read regulator 36 providing an output that is the desired optimum voltage which, as described previously, can be LEL plus 400 millivolts.

Maintaining the LEL and LPL can be convenient for program verify and erase verify for future calibrations that may be performed. For example, they are convenient beginning points. After multiple operations, both would be expected to degrade, so they would make useful starting levels for performing verification of a subsequent calibration. Subsequent calibrations may result in a new optimum as well. For example, a subsequent optimum may be the new LEL plus a reduced voltage such as 300 millivolts are even a midpoint between the new LEL and the new LPL.

The operation may be viewed as determining a particularly effective READ voltage and may be executed during test or any time during the life of the device to compensate for processing, aging, and cycling affects. The resulting voltage can be stored as digital values in registers and applied during normal operation. The result is compensation for processing and other variations by computing the necessary values for an individual array. This can be used to avoid imposing set of values determined by a costly and time consuming characterization of a sample of the entire population. In addition, opportunities for massive parallel testing and increased yield are available. Also this can enhance the quality and longevity of the individual devices.

By now it should be appreciated that there has been provided a method for determining a read reference level for a plurality of non-volatile memory cells. The method includes performing a program operation of the plurality of non-volatile memory cells. The method further includes determining a program level of a least programmed memory cell of the plurality of non-volatile memory cells. The method further includes performing an erase operation of the plurality of non-volatile memory cells. The method further includes determining an erase level of a least erased memory cell of the plurality of non-volatile memory cells. The method further includes determining an operating window between the program level and the erase level. The method further includes setting the read reference level to be a predetermined offset from the erase level if the operating window is determined to compare favorably to a predetermined value. The method may further comprise storing the program level, the erase level, and the read reference level. The method may have a further characterization by which storing the program level, the erase level, and the read reference level further comprises storing the program level, the erase level, and the read reference level in a protected portion of the plurality of non-volatile memory cells. The method may have a further characterization by which storing the program level, the erase level, and the read reference level further comprises storing the program level, the erase level, and the read reference level in a register file. The method may have a further characterization by which determining a program level of a least programmed memory cell further comprises determining a threshold voltage level of a least programmed memory cell of the plurality of memory cells. The method may have a further characterization by which determining a program level of a least programmed memory cell further comprises performing a program verify operation of the plurality of non-volatile memory cells while sweeping a word line voltage of a plurality of word lines for the plurality of non-volatile memory cells. The method may have a further characterization by which determining a read reference level for a plurality of non-volatile memory cells further comprises determining a read reference level for a plurality of thin film storage non-volatile memory cells. The method may have a further characterization by which the plurality of non-volatile memory cells comprises nanocrystals.

Also disclosed is a memory that includes a plurality of non-volatile memory cells, each of the non-volatile memory cells coupled to a word line and a bit line, wherein when programmed, the plurality of non-volatile memory cells having a program level distribution, and when erased, the plurality of non-volatile memory cells having an erase level distribution. The memory further includes a first register for storing a least programmed level of the program level distribution. The memory further includes a second register for storing a least erased level of the erase level distribution. The memory further includes a third register for storing a read reference level, wherein the read reference level is an offset level from the least erased level when a difference between the least programmed level and the least erased level compares favorably to a predetermined value. The memory further includes a controller circuit, coupled to the plurality of non-volatile memory cells, the controller circuit for controlling read operations to the plurality of non-volatile memory cells using the read reference level as a word line voltage. The memory may have a further characterization by which the plurality of non-volatile memory cells comprises a plurality of thin film storage non-volatile memory cells. The memory may have a further characterization by which. The memory may have a further characterization by which each of the plurality of non-volatile memory cells has a charge storage layer comprising nanocrystals. The memory may have a further characterization by which the least programmed level and the least erased level are characterized as being a least programmed threshold voltage and a least erased threshold voltage, respectively. The memory may have a further characterization by which the least programmed level and the least erased level are stored in a portion of the plurality of non-volatile memory cells. The memory may further include a row decoder coupled to the controller circuit and to the word line and a read voltage regulator for providing the word line voltage to the row decoder in response to receiving the read reference level from the third register. The memory may have a further characterization by which the least programmed level and the least erased level are determined during production testing of the memory.

Disclosed also is a memory including a memory array having a plurality of non-volatile memory cells, each of the non-volatile memory cells coupled to a word line and a bit line, wherein when programmed, the plurality of non-volatile memory cells having a program level distribution, and when erased, the plurality of non-volatile memory cells having an erase level distribution. The memory further includes a first portion of the memory array for storing a least programmed level of the program level distribution. The memory further includes a second portion of the memory array for storing a least erased level of the erase level distribution. The memory further includes a third portion of the memory array for storing a read reference level, wherein the read reference level is an offset level from the least erased level when a difference between the least programmed level and the least erased level compares favorably to a predetermined value. The memory further includes a controller circuit, coupled to the plurality of non-volatile memory cells, the controller circuit for controlling read operations to the plurality of non-volatile memory cells using the read reference level as a word line voltage. The memory may further include a first register of storing the least programmed level, a second register for storing the least erased level, and a third register for storing the read reference level. The memory may further include a row decoder coupled to the controller circuit and to the word line and a read voltage regulator, the read voltage regulator for providing the word line voltage to a row decoder in response to receiving the read reference level. The memory may have a further characterization by which the plurality of non-volatile memory cells comprises a plurality of thin film storage non-volatile memory cells.

Although the invention is described herein with reference to specific embodiments, various modifications and changes can be made without departing from the scope of the present invention as set forth in the claims below. For example, the operation was described for a particular architecture using N channel NVM memory cells, but other architectures and other types of memory cells may be found to be effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for determining a read reference level for a plurality of non-volatile memory cells, the method comprising:
    performing a program operation of the plurality of non-volatile memory cells;
    determining a program level of a least programmed memory cell of the plurality of non-volatile memory cells;
    performing an erase operation of the plurality of non-volatile memory cells;
    determining an erase level of a least erased memory cell of the plurality of non-volatile memory cells;
    determining an operating window between the program level and the erase level; and
    setting the read reference level to be a predetermined offset from the erase level if the operating window is determined to compare favorably to a predetermined value.

2. The method of claim 1, further comprising storing the program level, the erase level, and the read reference level.

3. The method of claim 2, wherein storing the program level, the erase level, and the read reference level further comprises storing the program level, the erase level, and the read reference level in a protected portion of the plurality of non-volatile memory cells.

4. The method of claim 2, wherein storing the program level, the erase level, and the read reference level further comprises storing the program level, the erase level, and the read reference level in a register file.

5. The method of claim 1, wherein determining a program level of a least programmed memory cell further comprises determining a threshold voltage level of a least programmed memory cell of the plurality of memory cells.

6. The method of claim 1, wherein determining a program level of a least programmed memory cell further comprises performing a program verify operation of the plurality of non-volatile memory cells while sweeping a word line voltage of a plurality of word lines for the plurality of non-volatile memory cells.

7. The method of claim 1, wherein determining an erase level of a least erased memory cell of the plurality of memory cells further comprises performing an erase verify operation of the plurality of non-volatile memory cells while sweeping a word line voltage for the plurality of memory cells.

8. The method of claim 1, wherein determining a read reference level for a plurality of non-volatile memory cells further comprises determining a read reference level for a plurality of thin film storage non-volatile memory cells.

9. The method of claim 8, wherein the plurality of non-volatile memory cells comprises nanocrystals.

10. A memory comprising:
    a plurality of non-volatile memory cells, each of the non-volatile memory cells coupled to a word line and a bit line, wherein when programmed, the plurality of non-volatile memory cells having a program level distribution, and when erased, the plurality of non-volatile memory cells having an erase level distribution;
    a first register for storing a least programmed level of the program level distribution;
    a second register for storing a least erased level of the erase level distribution;
    a third register for storing a read reference level, wherein the read reference level is an offset level from the least erased level when a difference between the least programmed level and the least erased level compares favorably to a predetermined value; and
    a controller circuit, coupled to the plurality of non-volatile memory cells, the controller circuit for controlling read operations to the plurality of non-volatile memory cells using the read reference level as a word line voltage.

11. The memory of claim 10, wherein the plurality of non-volatile memory cells comprises a plurality of thin film storage non-volatile memory cells.

12. The memory of claim 10, wherein each of the plurality of non-volatile memory cells has a charge storage layer comprising nanocrystals.

13. The memory of claim 10, wherein the least programmed level and the least erased level are characterized as being a least programmed threshold voltage and a least erased threshold voltage, respectively.

14. The memory of claim 10, the least programmed level and the least erased level are stored in a portion of the plurality of non-volatile memory cells.

15. The memory of claim 10, further comprising:
    a row decoder coupled to the controller circuit and to the word line; and
    a read voltage regulator for providing the word line voltage to the row decoder in response to receiving the read reference level from the third register.

16. The memory of claim 10, wherein the least programmed level and the least erased level are determined during production testing of the memory.

17. A memory comprising:
a memory array having a plurality of non-volatile memory cells, each of the non-volatile memory cells coupled to a word line and a bit line, wherein when programmed, the plurality of non-volatile memory cells having a program level distribution, and when erased, the plurality of non-volatile memory cells having an erase level distribution;
a first portion of the memory array for storing a least programmed level of the program level distribution;
a second portion of the memory array for storing a least erased level of the erase level distribution;
a third portion of the memory array for storing a read reference level, wherein the read reference level is an offset level from the least erased level when a difference between the least programmed level and the least erased level compares favorably to a predetermined value; and
a controller circuit, coupled to the plurality of non-volatile memory cells, the controller circuit for controlling read operations to the plurality of non-volatile memory cells using the read reference level as a word line voltage.

18. The memory of claim 17, further comprising a first register of storing the least programmed level, a second register for storing the least erased level, and a third register for storing the read reference level.

19. The memory of claim 17, further comprising:
a row decoder coupled to the controller circuit and to the word line; and
a read voltage regulator, the read voltage regulator for providing the word line voltage to a row decoder in response to receiving the read reference level.

20. The memory of claim 17, wherein the plurality of non-volatile memory cells comprises a plurality of thin film storage non-volatile memory cells.

* * * * *